United States Patent [19]

Alidio et al.

[11] Patent Number: 5,083,098

[45] Date of Patent: Jan. 21, 1992

[54] TUNABLE VCO FREQUENCY SENSITIVITY

[75] Inventors: Raul Alidio, Reseda; Robert Allison, Rancho Palos Verdes, both of Calif.

[73] Assignee: Hughes Aircraft Company, Los Angeles, Calif.

[21] Appl. No.: 542,860

[22] Filed: Jun. 25, 1990

[51] Int. Cl.$^5$ ............................................. H03B 5/18
[52] U.S. Cl. ................................. 331/99; 331/117 D; 331/177 V
[58] Field of Search ...................... 331/96, 99, 107 SL, 331/117 D, 177 V

[56] References Cited

U.S. PATENT DOCUMENTS 4,639,691 1/1987 Iigima ........................... 331/107 SL
4,660,002 4/1987 Iijima et al. ..................... 331/177 V

*Primary Examiner*—Siegfried H. Grimm
*Attorney, Agent, or Firm*—Leonard A. Alkov; Wanda K. Denson-Low

[57] ABSTRACT

A voltage controlled oscillator having an active network and a tuning network that includes a transmission line impedance transformer having a first end coupled to an output circuit of the VCO, and having a selectable effective width that determines the tuning bandwidth of the oscillator. A varactor diode is coupled to the second end of the transformer line, and a bias line is coupled between a tuning port and the varactor diode. The transmission line impedance transformer more particularly includes a main transformer line, a plurality of transmission lines adjacent the main transformer line, and wire bonds for electrically connecting selected ones of the plurality of lines to the main transformer line, whereby connection of selected ones of the transmission lines to the main transformer line increases the effective width of the impedance transformer.

3 Claims, 2 Drawing Sheets

TUNABLE VCO FREQUENCY SENSITIVITY

BACKGROUND OF THE INVENTION

The disclosed invention is directed generally to microwave voltage controlled oscillators, and is directed more particularly to a tunable network for a microwave voltage controlled oscillator that provides for tuning of a desired frequency sensitivity.

A microwave voltage controlled oscillator (VCO) is a circuit comprising microwave components for providing an output signal whose frequency is controlled by a control voltage. Microwave VCOs are utilized in radio frequency (RF) applications such as radar, microwave communications systems, and electronic warfare systems.

The tuning bandwidth of a VCO, i.e., the range over which the output frequency can be varied and also called the frequency sensitivity of the VCO, is typically different for different applications and requirements.

A known technique for controlling tuning bandwidth of a microwave VCO that includes a varactor diode in a tuning network is to include a variable resistor voltage divider between the diode and control voltage input which comprises the tuning port. However, the resistor voltage divider acting with the parasitic and RF by-pass capacitance of the VCO circuit reduces the modulation bandwidth attainable by the VCO. That is, the rate of change in varactor voltage is limited by the RC time constant of the resistor divider and capacitance of the circuit.

Tuning bandwidth can also be changed by adding a modulation amplifier with adjustable gain to the tuning port. However, the amplifier often introduces unacceptable phase noise to the oscillator output.

SUMMARY OF THE INVENTION

It would therefore be an advantage to provide a tuning network for a microwave VCO that provides for selection of tuning sensitivity without lowering the input impedance or modulation bandwidth of the tuning port, and without producing noise in the frequency output signal.

The foregoing and other advantages are provided in a microwave VCO tuning network that includes a transmission line impedance transformer having a first end coupled to an output circuit of the VCO, and having a selectable effective width that determines the tuning bandwidth of the oscillator. A varactor diode is coupled to the second end of the transformer line, and a bias line coupled is between a tuning port and the varactor diode. The transmission line impedance transformer more particularly includes a main transformer line, a plurality of transmission lines adjacent the main transformer line, and wire bonds for electrically connecting selected ones of the plurality of lines to the main transformer line, whereby connection of selected ones of the transmission lines to the main transformer line increases the effective width of the impedance transformer.

BRIEF DESCRIPTION OF THE DRAWING

The advantages and features of the disclosed invention will readily be appreciated by persons skilled in the art from the following detailed description when read conjunction with the drawing wherein.

DETAILED DESCRIPTION OF THE DISCLOSURE

Figure 1:
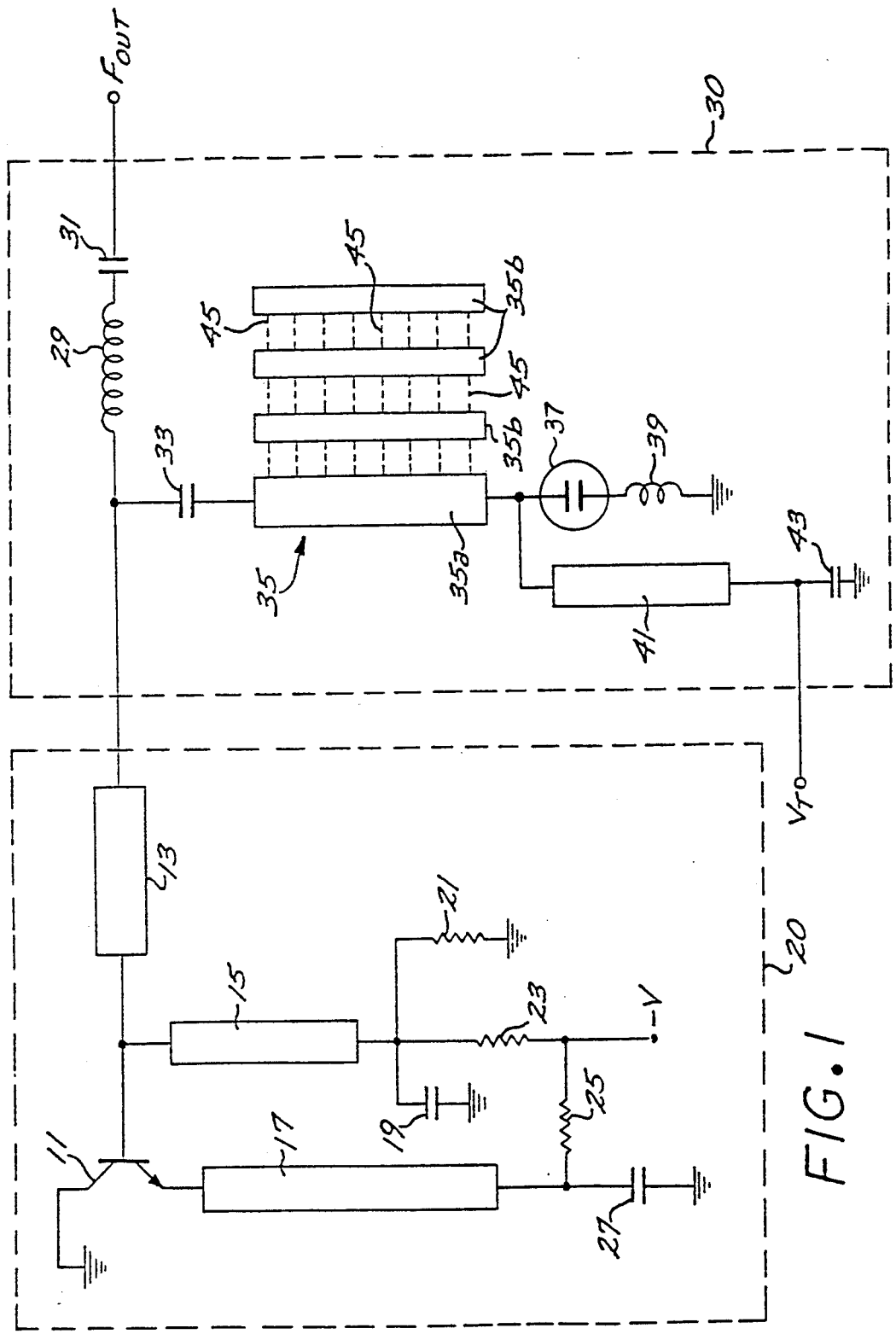
FIG. 1 is a circuit schematic of a microwave voltage controlled oscillator in accordance with the invention.

In the following detailed description and in the several figures of the drawing, like elements are identified with like reference numerals.

Referring now to FIG. 1, shown therein is a microwave voltage controlled oscillator (VCO) in accordance with the invention. The oscillator is generally a reflection amplifier that includes a one-port transistor network 20 and a tuning circuit 30.

The transistor network 20 includes a microwave transistor 11 which has its base connected to one end of a 50 ohm transmission line 13 and one end of a quarter wavelength bias line 15. The emitter of the microwave transistor 11 is connected to one end of a 90 ohm transmission line 17. The other ends of the bias line 15 and the 90 ohm transmission line 17 are connected to bias circuitry that includes a capacitor 19 and a resistor 21 connected in parallel between the bias line 15 and ground. A resistor 23 is connected between the bias line 15 and a source of bias voltage $-V$. A resistor 25 is connected between the 90 ohm transmission line 17 and the bias supply voltage $-V$, while a capacitor 27 is connected between the 90 ohm transmission line 17 and ground.

The other end of the 50 ohm transmission line 13 is connected to an output coupling network that includes an inductor 29 serially connected with a capacitor 31 which provides the oscillator output $F_{OUT}$.

The tuning circuit 30 includes a capacitor 33 connected between an impedance transformer 35 and the node between the 50 ohm line 13 and the output coupling inductor 29. The other end of the impedance transformer 35 is connected to the cathode of a varactor diode 37. An inductor 39 is connected between the anode of the varactor diode 37 and ground.

The impedance transformer 35 more particularly includes a primary transmission line 35a and secondary transmission lines 35b that are selectively electrically connected via wire bonds to the main transformer line, wherein the wire bond connections between adjacent connected transmission lines would be distributed along the lengths thereof. Possible wire bond connections are schematically depicted by the dashed lines 45 in FIG. 1. Electrical connection of secondary transmission lines 35b to the main transformer line 35a increases the effective width of the transformer, thereby lowering the characteristic impedance thereof. In particular, the effective width increases with the number of secondary transmission lines 35b that are connected to the main transmission line 35a.

The tuning circuit 30 further includes a quarter wavelength, high impedance transmission line 41 and a small capacitor 43 connected in series between the transformer 35 and ground. A tuning voltage $V_T$ is provided to the node between the high impedance line 41 and the capacitor 43.

The oscillator functions as follows. The transistor network is configured to have reflection gain (i.e., a reflection coefficient greater than 1). The tuning circuit and output coupling circuit provides the proper load reflection coefficient to the transistor network that causes successive reflections between the load and transistor network to build up into a stable oscillation at a selected microwave frequency. The oscillation frequency is the frequency at which the phase of the load reflection coefficient equals the phase of the reciprocal of the transistor network reflection coefficient. Frequency is tuned by varying the tuning voltage $V_T$ applied to the tuning varactor diode causing a variation in the varactor diode capacitance. The changing capacitance of the tuning varactor diode 37 changes the phase of the reflection coefficient of the tuning circuit versus frequency.

The function of the variable width transformer 35 is to vary the tuning circuit reflection coefficient phase versus frequency sensitivity allowing selectable tuning bandwidths. More particularly, the tuning sensitivity of the oscillator is determined by the effective width of the transformer 35, whereby the reactance of the impedance transformer is more frequency sensitive with increasing effective width. The effective width of the transformer 35 is increased by appropriately connecting selected ones of the secondary lines 35b to the main transformer line 35a by wire bonding.

Thus, to increase the sensitivity of the oscillator, desired ones of the secondary lines 35b are electrically connected to the primary transformer line 35a by wire bonds. It should be appreciated that such wire bonds can be between contiguous secondary lines 35b, and between the primary transformer line 35a and the secondary line 35b that is immediately adjacent thereto.

Figure 2:
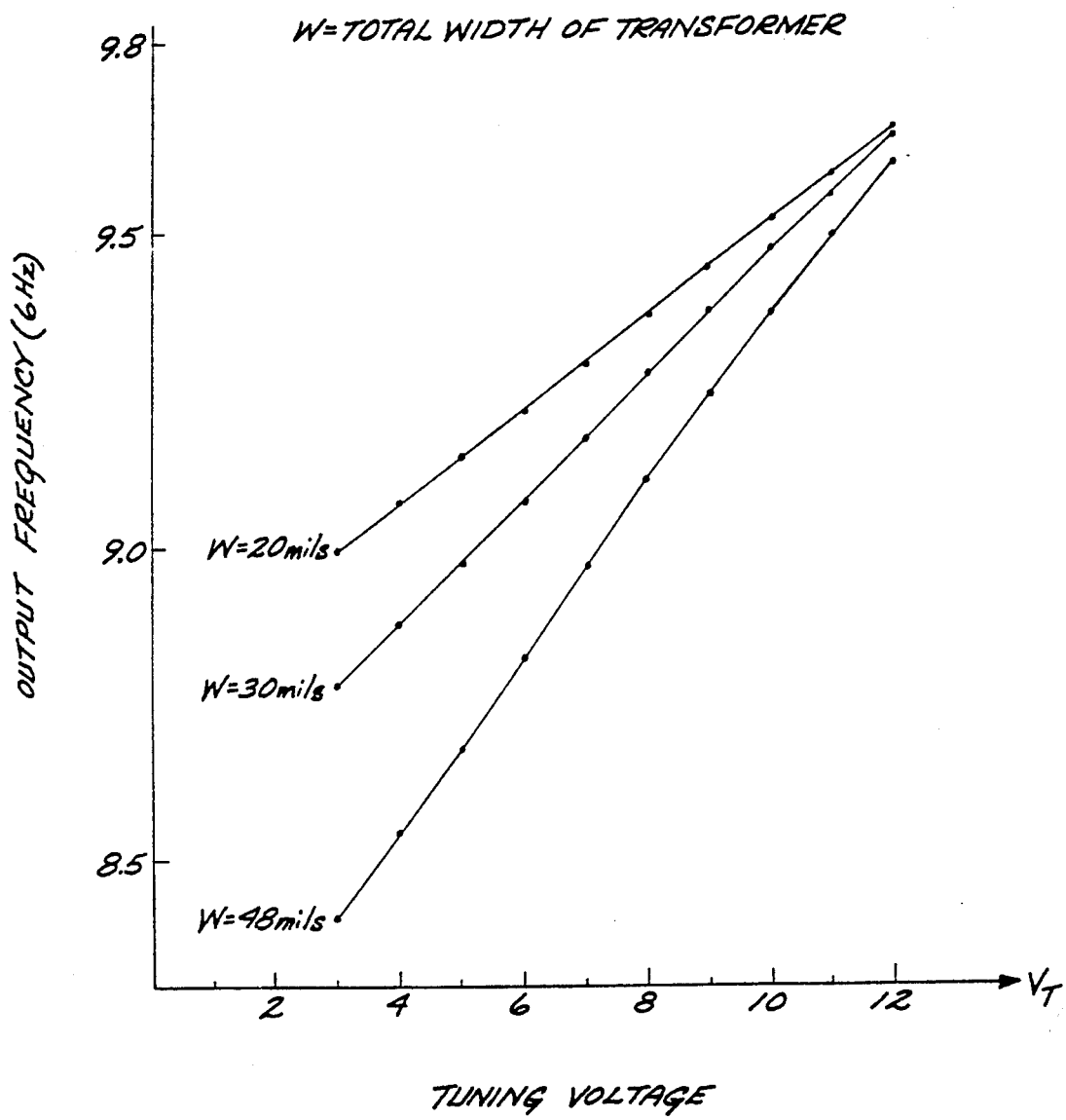
FIG. 2 is a graph illustrating different frequency sensitivities achieved with the voltage controlled oscillator of FIG. 1 with different effective transformer line widths.

Referring now to FIG. 2, set forth therein is a graph illustrating the different frequency sensitivities that were achieved with the voltage controlled oscillator of FIG. 1 with different effective transformer line widths. The data shown is for an oscillator circuit constructed on 25 mil alumina substrate material with thin film gold metallization. An NEC 64400 microwave bipolar transistor was utilized for the transistor network, and a GaAs hyper-abrupt varactor diode was utilized for the tuning circuit.

The foregoing has been a disclosure of a microwave VCO that advantageously provides for selection of tuning sensitivity without lowering the input impedance or modulating bandwidth of the tuning port, and without producing noise in the frequency output signal.

Although the foregoing has been a description and illustration of specific embodiments of the invention, various modifications and changes thereto can be made by persons skilled in the art without departing from the scope and spirit of the invention as defined by the following claims.

What is claimed is:

1. A tuning network for a microwave voltage controlled oscillator (VCO), comprising:
a transmission line impedance transformer having a first end coupled to an output circuit of the VCO, and having a selectable effective width, so that the effective width of the main transformer line is increased by connecting selected ones of said plurality of transmission lines to the main transformer line comprising:
a main transformer line,
a plurality of transmission lines adjacent said main transformer line, and
wire bonds for electrically connecting selected ones of said plurality of lines to said main transformer line, whereby connection of selected ones of said transmission lines to said main transformer line increases the effective width of said impedance transformer;
a varactor diode coupled to the second end of the transformer line; and
a bias line coupled between a tuning port and said varactor diode, said tuning port for accepting a tuning voltage;
whereby the tuning bandwidth of the oscillator is determined by the effective width of said transmission line impedance transformer.

2. A tuning network for a microwave voltage controlled oscillator (VCO), comprising:
a transmission line impedance transformer having a selectable impedance, said transformer having a first end coupled to an output circuit of the VCO comprising:
a main transformer line;
a plurality of transmission lines adjacent said main transformer line, and
wire bonds for electrically connecting selected ones of said plurality of lines to said main transformer line, whereby connection of selected ones of said transmission lines to said main transformer line increases the effective width of said impedance transformer;
a varactor diode coupled to the second end of the transformer line; and
a bias line coupled between a tuning port and said varactor diode, said tuning port for accepting a tuning voltage;
whereby the tuning bandwidth of the oscillator is determined by the impedance of said transmission line impedance transformer.

3. The tuning network of claim 1 further including a quarter wavelength, high impedance transmission line connected between said transmission line impedance transformer and ground.

* * * * *